United States Patent [19]
Ota

[11] Patent Number: 6,057,908
[45] Date of Patent: May 2, 2000

[54] EXPOSURE CONDITION MEASUREMENT METHOD

[75] Inventor: Kazuya Ota, Tokyo, Japan

[73] Assignee: Nikon Corporation, Tokyo, Japan

[21] Appl. No.: 08/908,961

[22] Filed: Aug. 8, 1997

[30] Foreign Application Priority Data

Aug. 8, 1996 [JP] Japan ..................................... 8-209790

[51] Int. Cl.$^7$ ........................... G03B 27/42; G03B 27/52; G01B 11/00
[52] U.S. Cl. .............................. 355/55; 355/53; 356/372; 356/401; 250/548; 430/5
[58] Field of Search ........................ 355/53, 55; 356/375, 356/372, 399, 400, 401; 250/548, 559.44; 430/5

[56] References Cited

U.S. PATENT DOCUMENTS

| | | | |
|---|---|---|---|
| 4,908,656 | 3/1990 | Suwa et al. ................................. | 355/53 |
| 5,475,490 | 12/1995 | Hirukawa et al. ....................... | 356/375 |

*Primary Examiner*—Alan A. Mathews
*Attorney, Agent, or Firm*—Morgan, Lewis & Bockius LLP

[57] ABSTRACT

Disclosed is a method to measure the actual exposure image of an evaluation pattern on a reticle with increased the accuracy to determine the best focus position. An evaluation mark is formed on a reticle. The evaluation mark is comprised of an arrangement in a lattice form (regular geometric arrangement) in the measurement direction, of multiple basic marks formed by the arrangement in the non-measurement direction of multiple wedge-shaped marks, which are pointed in the measurement direction. While the focus position of the wafer is changed and while the wafer is laterally shifted, the image of the evaluation mark is transferred onto the wafer. After the wafer is developed, the position of the image of the evaluation mark is measured by means of an alignment sensor. The center position of the image of the evaluation mark shifts towards the point of the wedge-shaped marks the closer the surface of the wafer comes to the best focus position. Therefore the focus position when the center of the image of the evaluation mark is positioned closest to the point of the wedge-shaped marks is made the best focus position.

31 Claims, 5 Drawing Sheets

EXPOSURE CONDITION MEASUREMENT METHOD

This application claims the benefit of Application No. 08-209790 filed in Japan on Aug. 8, 1996, which is hereby incorporated by reference.

BACKGROUND OF THE INVENTION

1. Field of the Invention

The present invention relates to an exposure condition measurement method which is used in the projection of the image of a mask pattern on to a photosensitive substrate via a projection optical system. In particular, the exposure condition measurement method of the present invention is suitable for use in cases where the image of an evaluation pattern on a mask is actually exposed on a photosensitive substrate and the optimal focus position of the projection optical system is obtained from that exposure image.

2. Related Background Art

In the past, in photo lithographic processes for the manufacture of semiconductor elements, liquid crystal display elements, image pickup elements (CCDs, etc.), thin film magnetic heads, etc., a projection exposure apparatus such as a stepper which performs batch exposure of the pattern on a reticle (known as a mask or photomask, etc.) onto each shot area of a wafer (a photosensitive substrate or glass plate, etc.) has often been used. Also, a scanning type projection exposure apparatus (step-and-scan method) is being used. In the step-and-scan method, the transfer exposure of the image of a pattern on a reticle onto each shot area on a wafer is accomplished by the synchronous scanning of the reticle and wafer in a state in which a portion of the pattern on the reticle is projected onto the wafer.

With these types of projection exposure systems, in order to transfer the pattern on the reticle onto the wafer with high precision, it is necessary to align the the position of the surface of the shot area of the wafer with the image-formation plane (the best focus position) of the projection optical system. For this purpose, before the exposure-transfer of the image of the pattern on the reticle onto the wafer, the best focus position of this projection exposure apparatus must be determined. In the past a method of obtaining this best focus position has been used whereby the image of a pattern for measurement on the reticle is actually exposed on the wafer while the wafer is moved in the height direction in specified intervals and the best focus position is obtained by the measurement of that exposed image using a suitable measurement instrument.

In the prior art method of obtaining the best focus position, the projection exposure apparatus is provided with an alignment sensor as a position detection apparatus for detecting the positional deviation between the reticle and wafer. Several different types of alignment sensors may be used to perform this function. For example, an LSA (laser step alignment) system may be used, whereby laser light is projected on alignment marks (in the form of a dotted line) on the wafer, and the position of the alignment mark is detected using the light refracted or scattered by the mark. Also, an FIA (field image alignment) system may be used, whereby illumination with a light having a wide wavelength band width (i.e. a halogen lamp) is performed, and the image data of the alignment mark that has been imaged is measured by picture processing. Finally, an LIA (laser interferometric alignment) system may be used, whereby alignment marks in the form of a diffraction grating on the wafer are illuminated from two directions with laser light having the same frequency or slightly different frequencies, and the two diffracted lights produced are made to interfere, whereby the position of the alignment mark is measured from the phase thereof.

In a method in which the best focus position is obtained based on the above-mentioned actual exposure image, an LSA-type alignment sensor has been used. In this case, a reticle, on which an evaluation pattern is formed, is used. The evaluation pattern contains, for example, multiple diamond-shaped patterns in the measurement direction arranged in a lattice form. In operation, while the position in the direction of the optical-axis of the projection optical system is changed in stages, the length of the exposure image obtained by the actual exposure of the evaluation pattern on the wafer is measured by means of an LSA-type alignment sensor, and the best focus position is detected from this measurement result.

FIG. 9 shows the exposure image of a conventional evaluation pattern on a wafer. Pattern images 51X1 through 51X3 (evaluation patterns for the X-axis) have a long diamond shape in the X-direction and pattern images 51Y1 through 51Y3 (evaluation patterns for the Y-axis) have a long diamond shape in the Y-direction are formed on the wafer. In operation, the closer the surface of the wafer approaches the best focus position, the longer the X-axis pattern images (51X1 through 51X3) become in the measurement direction (X direction) and the farther the position of the wafer is separated from the best focus position (de-focusing), the length of the pattern images in the measurement direction is shortened. Accordingly, the length of the pattern image in the measurement direction is measured by an LSA-type alignment sensor, and based upon the results thereof, the best focus position can be obtained.

Since the method of detecting the best focus position of the projection image system using a conventional LSA-type alignment sensor is a method whereby the length in the measurement direction of diamond-shaped mark images formed on the wafer are compared, the measurement precision is dependent upon the measurement precision of the LSA-type alignment sensor. In recent years, in conjunction with the integration of enhanced "super LSAs," circuit patterns on the reticle have been transferred at higher levels of precision onto the wafer. Nevertheless, in conventional methods using this LSA-type alignment sensor, there still exists the problem that it is difficult to further improve the detection precision of the best focus position.

Also, when diamond-shaped measurement marks are used as shown in FIG. 9 with an alignment sensor other than the generally used LSA-type (i.e. an FIA-type or LIA-type) in the projection exposure apparatus, the measurement of the best focus position is difficult.

SUMMARY OF THE INVENTION

Accordingly, the present invention is directed to an enhanced exposure condition measurement method that substantially obviates one or more of the problems due to limitations and disadvantages of the related art.

The present invention has a purpose of offering an exposure condition measurement method which is able to increase the detection precision of the best exposure condition.

The present invention, in light of these problems, has the purpose of offering an exposure condition measurement method which is able to increase the detection precision of the best focus position by using an LIA-type, high-precision alignment sensor in the measurement of exposure image conditions when the best focus condition of the image formation face of the projection optical system is obtained based upon the actual exposure image.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In accordance with the exposure condition measurement method of the present invention, the closer the surface of the photosensitive substrate comes to the optimal focus position, the more the center position of an evaluation mark, composed of intermediate constituent elements formed by the arrangement of wedge-shaped fine focus elements in the non-measurement direction, moves in a direction which lengthens the fine focus elements. Accordingly, the optimal focus position can be obtained by measurement of the location center position of the evaluation mark at various focus positions. Also, in the present invention, since intermediate constituent elements are arranged in a lattice form (regular geometric arrangement) in the measurement direction, the center position of the image of an evaluation mark can be detected with high accuracy using a high precision alignment sensor of a type which uses lattice marks, for example, an LIA-type (double light beam interference-type) or FIA-type (image pick-up type). Accordingly, there is the advantage that the precision of detection of the optimal focus position can be increased.

Also, in the case where a second evaluation mark, in which multiple patterns which are different from the intermediate constituent elements of the first evaluation mark are arranged in a lattice form in the measurement direction, is placed along the measurement direction with regard to the first evaluation mark, the second evaluation mark is also projected when the images of the first evaluation mark are projected respectively on partial areas of the photosensitive substrate for evaluation. The center position in the measurement direction of the images of the second evaluation mark are also measured when the center position in the measurement direction of the images of the first evaluation mark are measured. Thus, the optimal focus position of the projection optical system is determined based on changes in the interval between the center positions of the images of the two evaluation marks that have been measured. This provides an advantage in that the optimal focus position of the projection optical system can be detected at a high level of precision based on changes in the relative position of the images of the first evaluation mark and the images of the second evaluation mark.

Also, when the second evaluation mark is a line-and-space pattern arranged in the measurement direction, the center position of the image of that line-and-space pattern is not changed during focusing. Thus, using the position of that image as a standard, it is possible to detect changes in the position of the image of the first evaluation mark and to detect the optimal focus position based upon these results.

Furthermore, when the second evaluation mark is a pattern obtained by the inversion of the first evaluation mark with regard to the measurement direction, changes in the center position between the images of the first and second evaluation marks are doubled with regard to changes in the focus position, offering the advantage that the detection sensitivity of the optimal focus position can be doubled.

Also, in cases where, in the measurement of the center position of the image of the first evaluation mark, two coherent light beams are projected from different directions with regard to this first evaluation mark, the interference light from the pair of diffraction light beams produced in the same direction from the first evaluation mark can be received. The phase of this interference light, detected by an LIA-type alignment sensor, is used to determine the position of the image of the evaluation mark. By using an LIA-type alignment sensor, the precision with which the optimal focus position of the projection optical system is detected can be increased.

To achieve these and other advantages and in accordance with the purpose of the present invention, as embodied and broadly described, the exposure condition measurement method of the present invention is used in the projection of the image of a mask pattern on a photosensitive substrate via a projection optical system. The exposure condition measurement method is characterized by the fact that a first evaluation mark is prepared on the mask, wherein the first evaluation mark consists of multiple intermediate constituent elements, which are formed by the linear alignment of fine focus elements, formed in a wedge shape in the measurement direction (X-direction), and in a non-measurement direction (Y-direction) perpendicular to the above-mentioned measurement direction. Furthermore, the multiple intermediate constituent elements are arranged in a regular geometrical arrangement in the measurement direction. The evaluation mark is placed on the surface of the mask at a specified measurement point within the exposure field of the projection optical system. The image of the above-mentioned evaluation mark is projected via the projection optical system on multiple differing partial areas on the photosensitive substrate for evaluation while the position of the optical axis (Z-direction) of the projection optical system is changed. Thus, each exposed image of the evaluation mark on the photosensitive substrate corresponds to a different position of the projection optical system along the optical axis (Z-direction). Each exposed image of the evaluation mark on the photosensitive substrate is evaluated and measured, and based on these measurement results, the optimal focus position of the projection optical system (best focus position of the image formation plane) at the above-mentioned specified measurement point is obtained.

According to the exposure condition measurement method of the present invention, the closer the focus position of the surface of the photosensitive substrate comes to the optimal focus position, the longer the image of the wedge-shaped fine focus elements on the photosensitive substrate becomes (the wedge becomes more pronounced in the measurement direction). Specifically, the closer the photosensitive substrate comes to the optimal focus position, the more the center position of the image of the entire evaluation mark (consisting of multiple intermediate constituent elements each made up of many wedge-shaped fine focus elements) moves in the direction of the point of the fine focus elements. For this reason, the optimal focus position can be obtained merely by measuring the center position of the evaluation mark image.

Because the evaluation mark is formed by the arrangement of the intermediate constituent elements, formed by the alignment of multiple wedge-shaped fine focus elements in the non-measurement direction, in a regular geometrical arrangement in the measurement direction, the center position of the image of the evaluation mark in the measurement direction can be measured, for example, by means of an LIA-type (2 light beam interference type) alignment sensor. Since an LIA-type alignment sensor has superior measurement precision, the precision of measurement of the optimal focus position is also improved. The center position of the image of this type of evaluation mark in the measurement direction can also be measured by means of an alignment sensor of an FIA-type (image pick-up type).

In another aspect, the exposure condition measurement method of the present invention includes the use of a second evaluation mark. This second evaluation mark consists of multiple patterns differing from the intermediate constituent elements of the first evaluation mark. The multiple patterns of the second evaluation mark are arranged in a regular geometrical arrangement in the measurement direction thereof and are aligned in the measurement direction with regard to the first evaluation marks. When the image of the first evaluation mark is projected on the respective partial areas on the photosensitive substrate for evaluation, the image of the second evaluation mark is also projected. Furthermore, when the center position in the measurement direction of the image of the first evaluation mark is measured, the center position in the measurement direction of the image of the second evaluation mark is also measured. Thus, based upon changes in the distance between the center positions of the images of the two measured evaluation marks, the optimal focus position of the projection optical system can be obtained.

In yet another aspect, the exposure condition measurement method of the present invention includes the use of a second, different type of evaluation mark. This second evaluation mark is formed by the arrangement of multiple patterns in a regular geometrical arrangement different from the intermediate constituent elements of the first evaluation mark. The second evaluation mark is arranged in the non-measurement direction with regard to the first evaluation mark. When the image of the first evaluation mark is projected on partial areas on the photosensitive substrate for evaluation, the image of the second mark is also projected. Furthermore, when the center position of the image of the first evaluation mark is measured along the measurement direction, the center position of the image of the second evaluation mark is also measured. Thus, the optimal focus position of the projection optical system can be obtained based upon the changes in the difference in the center positions of the images of the two evaluation marks that have been measured. By scanning the images of the two evaluation marks, for example, in the non-measurement direction with regard to the measurement device, the relative difference of the center positions of the two images can be detected, based upon which the optimal focus position of the projection optical system can be detected with high degree of accuracy.

Yet another example of a second evaluation mark is a line-and-space pattern aligned in the measurement direction. Because the position of the measurement direction of the image of this pattern does not change even when de-focused, it can be used as a relative measurement standard.

In still another aspect, the exposure condition measurement method of the present invention includes the use of a different second evaluation mark. This second evaluation mark is formed by inverting the first evaluation mark in relation to the measurement direction thereof, while second evaluation mark is formed by inverting the first evaluation mark in relation to the non-measurement direction thereof By this means, changes in the center position between the first and second evaluation marks become doubled, and thus the optimal focus position detection sensitivity is doubled.

Finally, when the center position of the image of the first evaluation mark is measured, it is desirable that two coherent light beams be irradiated from different directions with regard to the first evaluation mark. Thus, the interference light formed by the pair of diffracted light beams generated from this first evaluation mark can be received, and the phase of this interference light can thus be detected. This means that the evaluation mark image is detected by means of an LIA-type alignment sensor.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention. In the drawings.

DESCRIPTION OF THE PREFERRED EMBODIMENTS

Reference will now be made in detail to the preferred embodiments of the present invention, examples of which are illustrated in the accompanying drawings.

One example of a preferred embodiment of the present invention is explained referring to FIG. 1 through FIG. 8. This example is one in which the present invention is applied in the case where the best focus position (the image-formation plane) of the projection optical system is obtained in a stepper type projection exposure apparatus.

Figure 1:
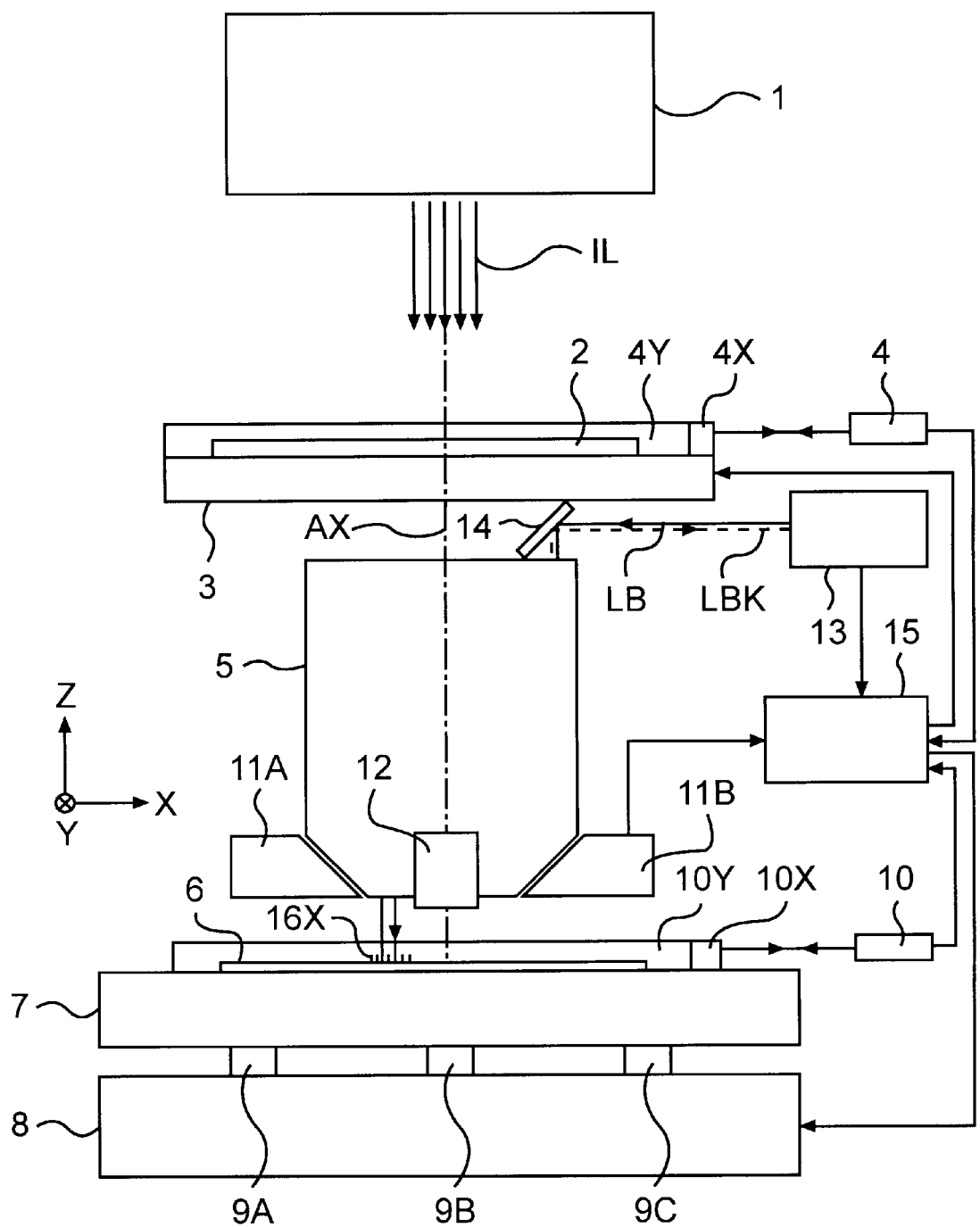
FIG. 1 is an abbreviated structural diagram showing the projection exposure apparatus used in an example of a preferred embodiment of the present invention.

FIG. 1 shows a simplified configuration of the projection exposure apparatus used in this example. The exposure is performed by means of illumination light IL of a specified wavelength projected from an illumination optical system 1, including a light source, a fly-eye lens, a field stop, and a condenser lens. Pattern areas of the reticle 2 are illuminated at a uniform luminance distribution, and based on this illumination light IL, the image of the pattern of the reticle 2 is transferred to each shot area on the wafer 6 at a projection reduction ratio (for example, ¼ or ⅕) via the projection optical system 5. In this case, a bright line (g-ray, i-ray, etc.) in the ultraviolet region of a mercury lamp, an ArF excimer laser light, an KrF excimer laser light, the I-harmonics of a copper vapor laser, or a YAG laser can be used as the illumination light IL. In the following explanation, the Z-axis is taken as parallel to the optical axis AX of the projection optical system 5, the X-axis is taken as parallel to the sheet plane of FIG. 1 (in a 2-dimensional plane perpendicular to the Z axis), and the Y-axis is taken as perpendicular to the X-axis in the sheet plane of FIG. 1.

The reticle 2 is mounted on a reticle stage (platform) 3 which can be finely adjusted in the X-direction and the Y-direction. The reticle stage 3 can also be finely adjusted in the rotational direction. At the end of the reticle stage 3 in the X-direction, an X-axis moveable mirror 4X which reflects the laser beam from an attached external laser interferometer 4. The position in the X-direction of the reticle stage 3 is detected by means of the X-axis laser interferometer 4 and moveable mirror 4X. Also, at the Y-direction end of the reticle stage 3, a Y-axis moveable mirror 4Y, which reflects the laser beam from an external interferometer (not shown in the figure) is attached. The position of the reticle stage 3 in the Y-direction is detected by means of this laser interferometer and movable mirror 4Y. The measurement values of the X-axis laser interferometer 4 and Y-axis laser interferometer are supplied to a main control system 15 which performs general control of the entire apparatus. The main control system 15 controls the position of the reticle stage 3 via a reticle stage driving system (not shown in the figure) based upon these measurement values.

The wafer (photosensitive material) 6 is held on a Z-tilt stage (platform) 7 via a wafer holder (not shown in the figure), and the Z-tilt stage 7 is mounted on an XY stage 8 via three actuators 9A–9C which move independently in the Z-direction. The XY stage (platform) 8 is constructed so as to be able to move independently in the X and Y directions, and is driven in the X-direction and Y-direction by means of a wafer stage driving system (not shown in the figure). The image of the pattern of the reticle 2 is transferred to each shot area of the wafer 4 in a step-and-repeat mode. The position in the Z-direction (focus position) of the Z-tilt stage 7 is adjusted by the parallel expansion and contraction of the three actuators 9A–9C, while the adjustment of the angle of inclination of the Z-tilt stage 7 about the X-axis and Y-axis is performed by individually adjusting the expansion/contraction amounts of the three actuators 9A–9C.

The X-coordinates of the wafer 6 are constantly monitored by means of the X-axis moveable mirror 10X which is mounted at the upper end of the Z-tilt stage 7 and an external laser interferometer 10, while the Y-coordinates of the wafer 6 are constantly monitored by means of a Y-axis movable mirror 10Y and an external laser interferometer (not shown in the figure). The X-coordinates and Y-coordinates that have been detected by means of the X-axis laser interferometer 10 and Y-axis laser interferometer are supplied to the main control system 15. The main control system 15 controls the operation of the XY stage 8 via a wafer stage driving system based upon these supplied coordinates. Also, an X-axis wafer mark 16X and Y-axis wafer mark form a diffraction grating for alignment on each shot area on the wafer 6. These wafer marks 16X are measured by means of an LIA-type alignment sensor 13.

In the evaluation of the best focus position of the projection optical system 5, a wafer for test printing is loaded (similarly to wafer 6) onto the Z-tilt stage 7, and the position of the image of the evaluation mark formed on each shot area of the wafer is measured by means of the alignment sensor 13. This is discussed in more detail below.

Also, a focal point position detection system 11 composed of a light transmitting optical system 11A and light receiving optical system 11B for detecting the position of the surface of the wafer 6 in the Z-direction is provided on the apparatus shown in FIG. 1. A slit image is projected with regard to multiple specified measurement points within the exposure field of the projection optical system 5 on the wafer 6 from the light transmitting optical system 11A. The reflected light from the wafer 6, in accordance with this slit image, is received by the light receiving optical system 11B, and by determining the lateral deviation amount of the slit image that has been reformed, the Z-direction positions of multiple measurement points within the exposure field are detected. The Z-direction position information of the wafer 6, obtained by means of this focal point position detection system 11, is supplied to the main control system 15. Based upon this Z-direction position information, the main control system 15 aligns the position in the Z-direction and the angle of inclination of the wafer 6 on the Z tilt stage 7 with the image formation plane of the projection optical system 5 via the three actuators 9A–9C. The best focus position (the image formation-plane) in this case is obtained by a printing test as described below.

In the apparatus in this example, a TTL-type (through-the-lens), LIA-type alignment sensor 13 is provided. This LIA-type alignment sensor 13 is briefly explained below. In the alignment sensor 13, a double frequency laser generating system which generates two laser beams of a predetermined wavelength (having slightly differing frequencies) is provided. These two laser beams are emitted at a specified intersecting angle from this double frequency laser generating system. A portion of the two laser beams is diffracted from a reference mark (having a lattice form) placed inside the alignment sensor 13 and a $\pm 1^{st}$ order diffraction pattern is generated. The remaining portion of these two laser beams (referred to as laser beam LB) is emitted from the alignment sensor 13, directed along the optical path by the turning mirror 14, and enters the upper portion of the projection optical system 5. The laser beam LB is made to irradiate the wafer mark 16X on the wafer 6 at a specified angle of intersection with regard to the X-direction via the projection optical system 5. A $\pm 1^{st}$ order diffraction pattern is generated by the laser beam LB from the wafer mark 16X. The heterodyne beam composed of this $\pm 1^{st}$ order diffraction pattern is taken as the wafer mark detection light LBK. The wafer mark detection light LBK returns to the original light path and is incident into the alignment sensor 13. In the alignment sensor 13, photoelectric conversion elements such as photo diodes, which receive the wafer detection light LBK and $\pm 1^{st}$ order diffraction pattern from the reference mark, respectively, are provided, and a wafer beat signal corresponding to the wafer mark 16X and reference beat signal corresponding to the reference mark are output from these photoelectric conversion elements. The wafer beat signal and reference beat signal are provided to the main control system 15. The main control system 15, based upon the phase difference of these beat signals and the positional information obtained by the laser interferometer 10 of the XY stage 8, detects the X-coordinates of the stage coordinate system of the wafer mark 16X.

Specifically, when the position detection of the wafer mark 16X is performed, the phase difference between the reference beat signal from the photoelectric conversion element corresponding to the reference mark and the wafer beat signal from the photoelectric conversion element corresponding to the wafer mark 16X is obtained by the main control system 15. Then the XY stage 8 is shifted in the X-direction by the main control system 15 so that this phase difference becomes, for example, 0 and when the phase difference has become 0, the X-coordinates of the XY stage 8 measured by the laser interferometer 10 are stored as the X-coordinates of that wafer mark. Also, in the apparatus of this example (although not shown in the figure), a Y-axis LIA type alignment sensor is also provided, and the coordinate position of the Y-axis wafer mark on the wafer 6 is detected by means of the Y-axis alignment sensor.

In addition, an off-axis type and FIA-type alignment sensor 12 is placed on the lateral face in the Y-direction of the projection optical system 5 in the apparatus of this example. Alignment light is projected from the alignment sensor 12 onto an FIA alignment mark formed on the wafer 6 (not shown in the figure). The detection light from that FIA alignment mark is received, and the image of that mark is formed on an index plate in the alignment sensor 12. In addition, this mark image and the image of an index mark are relayed onto an image pickup element such as a 2-dimensional CCD in the alignment sensor 12. The image pickup signals corresponding to the image of the index mark and the image of the FIA alignment mark are output from the image pickup element. This imaging signal is supplied to the main control system 15, and the main control system 15 detects the coordinates of the alignment mark based upon the imaging signal. Also, in this example, this FIA-type alignment sensor is mainly used for the rough positioning of the wafer 6. However, this FIA-type alignment sensor 12 could also be used for more fine, precise, positioning of the wafer 6 where the wafer mark 16X on the wafer 6 is detected by means of the alignment sensor 12.

Next, the method of obtaining the best focus position in this example is explained. In the present example a test reticle 2 for the formation of a specified evaluation pattern is used, and while the test wafer 6 is moved in stages in the height direction (Z-direction) in a specified amplitude, the image of the evaluation pattern on the reticle 2 is exposed on to the wafer 6 each time movement in the Z-direction occurs. After development, the exposure image of the evaluation pattern is measured by means of an LIA-type alignment sensor 13. This is explained below in detail.

Figure 2:
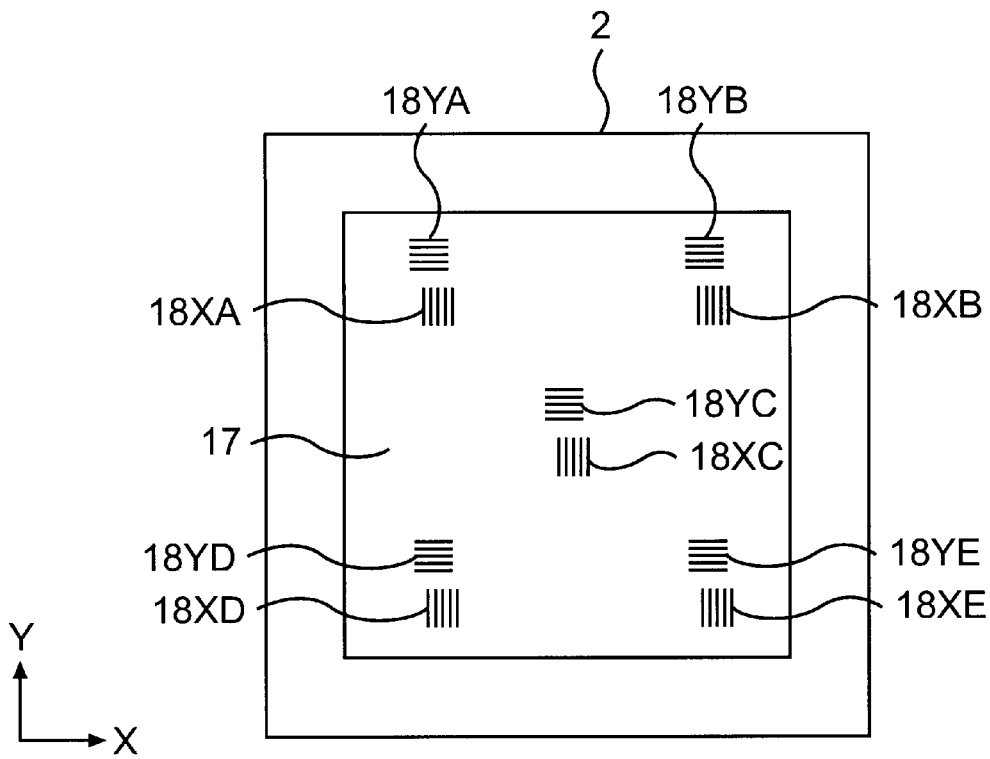
FIG. 2 is a plan view showing the arrangement of the evaluation mark on the reticle used in a preferred embodiment of the present invention.

FIG. 2 is a plan view for the explanation of the evaluation pattern on the reticle 2. In FIG. 2 an evaluation pattern which is composed of identical evaluation marks 18XA–18XE for the X-axis composed of multiple marks extending in the Y-direction and identical evaluation marks 18YA–18YE for the Y-axis composed of multiple marks extending in the X-direction is formed near the 4 corners and in the center of the pattern area 17 on the reticle 2. The evaluation marks are formed in order to detect the best focus position. In the evaluation pattern, the X-axis evaluation marks and Y-axis evaluation marks are each formed in pairs. Also (although not shown in the figure), marks formed by search alignment marks formed on the pattern area 17 of the reticle 2 are transferred to the wafer.

Figure 4:
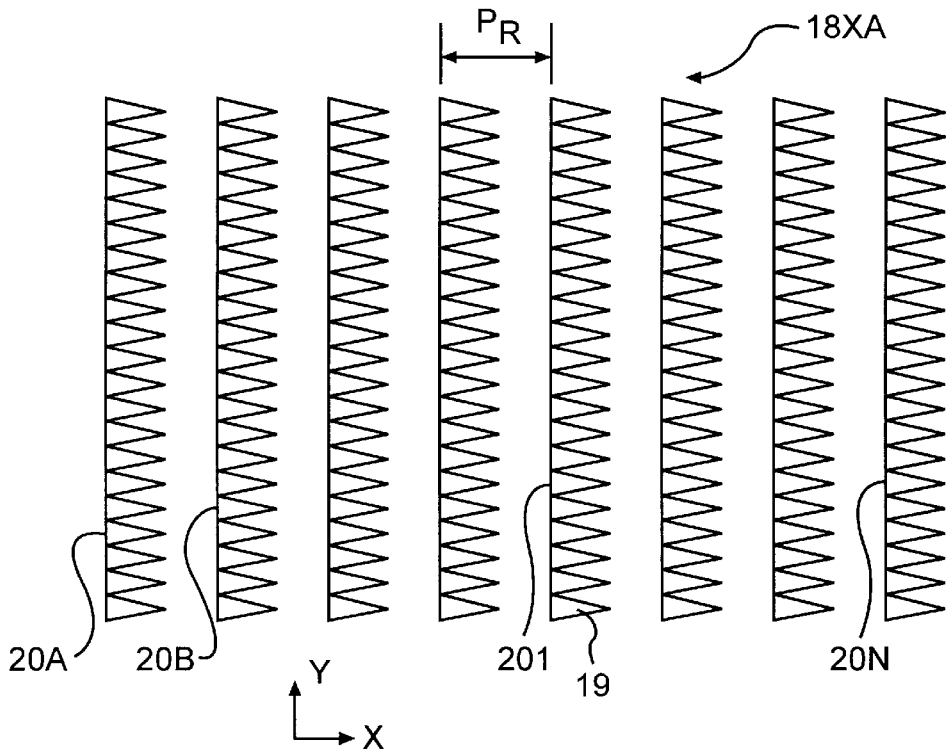
FIG. 4 is an enlarged plan view of a part of the evaluation mark shown in FIG. 2.

FIG. 4 shows an enlarged plan view of the evaluation mark 18XA for the X-axis. FIG. 4 indicates the condition in which the X-axis evaluation mark 18XA has been projected onto the wafer. As shown in FIG. 4, the evaluation mark 18XA is formed by the forming of multiple basic marks 20A, 20B, . . . , 20N having a saw-tooth form extending in the Y-direction formed at a constant pitch PR in the X-direction. As a whole, these multiple basic marks with saw-tooth shapes, form a diffraction grating. By forming multiple wedge-shaped fine marks (as indicated by the fine marks 19) in mutual contact oriented in the Y-direction having a tapered form which gradually grows narrower in the +X direction, the respective basic marks 20A through 20N are formed. Specifically, the evaluation mark 18XA macroscopically is a diffraction grating having a pitch PR in the X- direction, and microscopically is composed so that each one mark of this diffraction grating has wedges arranged in the Y-direction in a saw-tooth form. Also, the Y-axis evaluation mark 18YA is formed by the 90 degree rotation of the X-axis evaluation mark 18XA.

Prior to the detection of the best focus position, the reticle 2 upon which an evaluation pattern has been formed as described above is first loaded on the reticle stage 3 as shown in FIG. 1. Next, the three actuators 9A–9C are driven by means of the main control system 15, and while the Z-tilt stage 7 is moved in small intervals in the Z-direction, irradiation with irradiation light IL is performed for each movement. Thus, the evaluation pattern on the reticle 2 is exposed/transferred on one shot area on the wafer 6. In this case, exposure is performed by fine adjustment of the XY stage 8 while the wafer 6 is stepped a small amount at a time within a 2-dimensional plane so that the exposure image is not superposed for each movement in the Z-direction. The interval of movement of the wafer 6 in the Z-direction in this case is initially 1 $\mu$m to several $\mu$m, for example. Also, when the best focus position has nearly been specified as described below, the interval of movement is made even finer, for example, 0.01 $\mu$m to 0.05 $\mu$m, and exposure can be performed. Also, after exposure on one shot area has been completed, in order to obtain an averaging effect, exposure can be performed while the position in the Z-direction of the evaluation pattern on the reticle 2 is changed by means of a similar method with regard to the other multiple shot areas on the wafer 6 (i.e. by means of a step and repeat method driving the XY stage 8). After exposure has been completed, the wafer 6 is unloaded from the Z-tilt stage 7 and development is performed in the development process. In each shot area which has been exposed with the evaluation pattern on the wafer 6, images of the evaluation pattern on the reticle 2 in FIG. 2 are formed in a state of deviation by a specified amount.

Next, the developed wafer 6 is once again loaded onto the Z-tilt stage 7. Next, the search alignment mark (not shown in the figure) formed on the wafer 6 is detected by means of an FIA-type alignment sensor 12, and search alignment is performed whereby the general arrangement coordinates in the stage coordinate system of each shot area on the wafer 6 is obtained. Thereafter, the position of the evaluation pattern image on a shot area on the wafer 6 is measured by means of an LIA-type alignment sensor 13. The general coordinate position of this shot can be obtained in advance by search alignment. The evaluation mark image inside this shot area is sequentially moved to the measurement point of the LIA-type alignment sensor 13, and the position of each evaluation pattern image is detected. On this shot area, evaluation images are formed bit by bit in positions corresponding to the evaluation pattern on the reticle 2 of FIG. 2.

Figure 3:
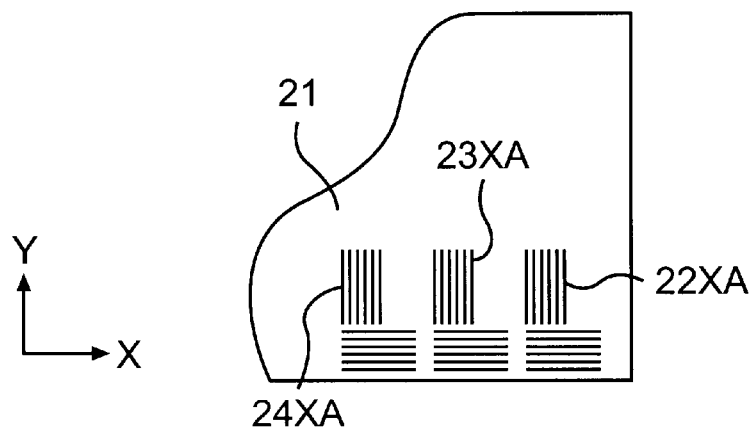
FIG. 3 is a partially enlarged plan view showing the image exposed on the wafer when the focus position of the evaluation mark in FIG. 2 is changed and displaced laterally.

FIG. 3 is an enlarged diagram showing an evaluation pattern image formed on the measurement shot area 21 on a wafer. In FIG. 3, three evaluation pattern images 22XA, 23XA, and 24XA are formed, each displaced by a specified width. In actuality, more numerous evaluation pattern images are formed. The deviation amount from the target position obtained by the search alignment of the position of these evaluation pattern images 22XA through 24XA is measured by means of an LIA-type alignment sensor 13. Also, a target value in the interval of the evaluation pattern images 22XA through 24XA in the X-direction is measured precisely by means of a laser interferometer 10 at the time of exposure.

Figure 5:
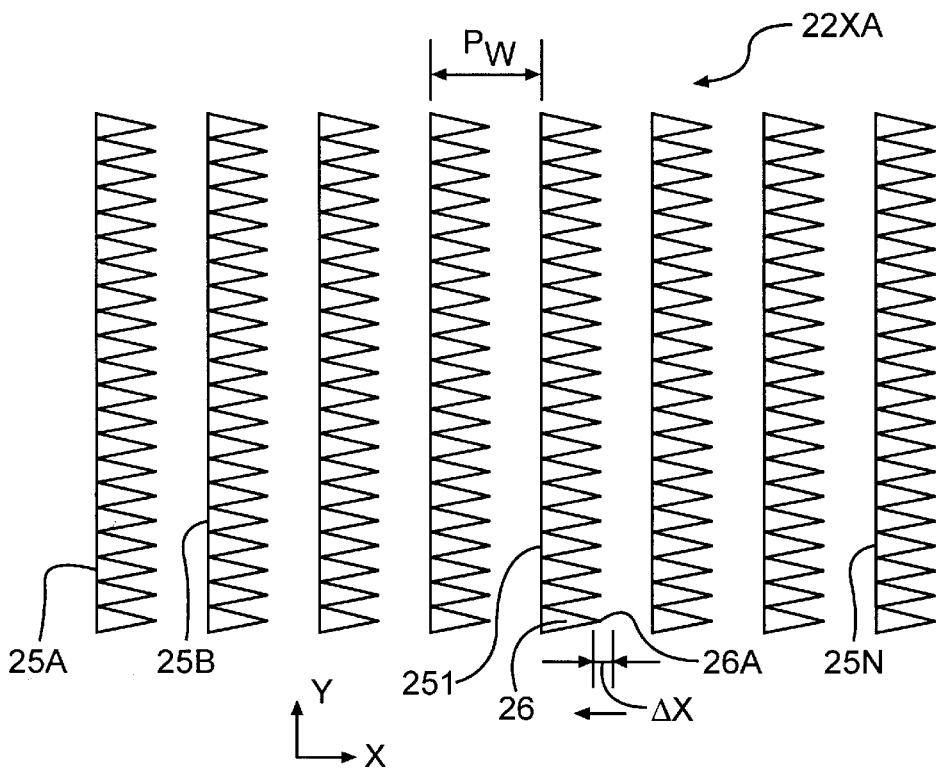
FIG. 5 is a plan view showing the exposure image obtained by the exposure of the evaluation mark in FIG. 4 on the wafer.

FIG. 5 is an enlarged diagram of one evaluation pattern image 22XA in FIG. 3. As shown in FIG. 5, the evaluation pattern image 22XA is formed similarly to the evaluation mark 18XA in FIG. 4, with basic pattern images 25A through 25N arranged at a pitch PW in the measurement direction (here, the X-direction). In FIG. 5, for example, as shown in the fine pattern image 26 corresponding to the fine mark 19 in FIG. 4, a blurred image (shown as a solid line) indicates the actual exposure image, and the sharp pattern image 26A (shown as a dotted line) indicates the exposure image where the surface of the wafer 6 is in a position close to the best focus position. In this way, the width of the wedge shaped pattern in the measurement direction (X-direction) is shortened as it is separated from the best focus position. In the case of FIG. 5, the width is narrowed only by ΔX in the measurement direction. The position of the left edge of the wedge-shaped fine pattern image 26 does not change in accordance with the focus position, and thus, the center position of the fine pattern image 26 shifts in the left direction (−X direction) as the wafer 6 is separated from the best focus position. In conjunction with this, the measurement position of the evaluation pattern image 22XA in accordance with the alignment sensor 13 is displaced in the left direction (−X direction) with regard to the target position. Accordingly, when the position of the evaluation pattern images 22XA through 24XA in FIG. 3 is measured by the alignment sensor 13, the focus position when the evaluation pattern image having X-coordinates at the right-most direction (+X direction) with regard to the target position becomes the best focus position in the X-direction at the measurement point corresponding to the evaluation mark 18XA in FIG. 2. The best focus position in the X direction in this case, as can be seen from FIG. 5, means the best focus position obtained by a light beam converging in the Y-direction.

In this case, the evaluation pattern images 22XA through 24XA are transferred while the focus position is changed in specified intervals, and during this time the X-coordinates (amount of deviation from the target position) of the evaluation pattern in the focus position can be calculated using a suitable interpolation method, and the best focus position should be obtained based upon these results. Also, the correlation between each focus position and the X-coordinates of the evaluation pattern image should be obtained in the form of a line or the form of a function by curve approximation, and the best focus position obtained based thereon. In this example, the wedge-shaped fine pattern image 26 having an apex in the +X direction was used. But, when a wedge-shaped fine pattern image having an apex in the −X direction is used, the focus position where the evaluation pattern image is displaced in the left direction (−X direction) to the greatest extent with regard to the target position becomes the best focus position. This occurs because the center position of the fine pattern image moves to the left (−X direction).

Similarly, also at the measurement points corresponding to the other four evaluation marks 18XB through 18XE on the reticle 2 in FIG. 2, the best focus position is obtained based upon the lateral displacement of the evaluation pattern image on the shot area 21. By this means, the best focus positions in the X-direction on five measurement points within the exposure field of the projection optical system 5 in FIG. 1 are obtained.

Next, by means of a similar method to that whereby the best focus position on the shot area 21 in the X-direction is obtained, the amount of displacement of the evaluation marks 18YA through 18YE for the Y-axis on the reticle (2) in FIG. 2 from the target position of the evaluation pattern image on the shot area 21 is measured by means of a Y-axis LIA alignment sensor. Thus, the best focus position in the Y-direction (actually, the best focus position according to the light beam converging in the X-direction) at five measurement points within the exposure field is obtained. The finite difference of the best focus positions in the X-direction and Y-direction at these five measurement points becomes the astigmatism at each measurement point. Also, if hypothetically the average value of the best focus position in the X-direction and the Y-direction is taken as the best focus position at that measurement point, the field curvature and field inclination of the image formation surface of the projection optical system 5 can be obtained from the best focus position at these five measurement points. Also, the average value of the five best focus positions can be considered as the average best focus position on the image formation plane.

Similar processing is performed with regard to the shot areas of the other measurement objects on the wafer 6, and the best focus positions in the X-direction and Y-direction are obtained for the respective five measurement points. Next, by averaging the best focus positions obtained with regard to those multiple shot areas, the best focus position is calculated more accurately. In actual exposure, the three actuators 9A–9C are driven so that the wafer is aligned with the image formation plane that has been calculated in this way.

In the present example, five evaluation marks each for the X-axis and the Y-axis are formed on the reticle 2, and the best focus position is obtained based upon the evaluation pattern images exposed on the wafer 6, but the number and orientation of the evaluation patterns can be varied in accordance with the application.

In the foregoing, as evaluation marks for obtaining the best focus position in accordance with this working example, basic marks 20A through 20N were formed by arranging multiple wedge-shaped fine marks 19 in the Y-direction as indicated by the evaluation mark 18XA in FIG. 4. A pattern composed of a lattice (a regular geometrical arrangement) in which these multiple saw-toothed basic marks 20A, 20B, . . . , 20N are arranged at a fixed pitch PR in the X-direction is used, so that using the LIA-type alignment sensor 13, the position of the evaluation pattern images formed on each shot area of the wafer 6 can be measured. Also, since this LIA-type alignment sensor can accurately detect the positions of the evaluation pattern images based on the phase of the optical beat signal, the best focus position can be detected with the same or superior accuracy as a measurement method in which a conventional LSA-type alignment sensor is used.

Also, in the present example, as a detection apparatus for measuring the evaluation pattern images on the wafer 6, a projection exposure apparatus for forming pattern images of the reticle on the wafer is used. But, a detection apparatus having an LIA-type alignment sensor may also be provided separately off-line, and the position of the evaluation pattern images on the wafer 6 could be further detected by means of that detection apparatus.

Figure 6:
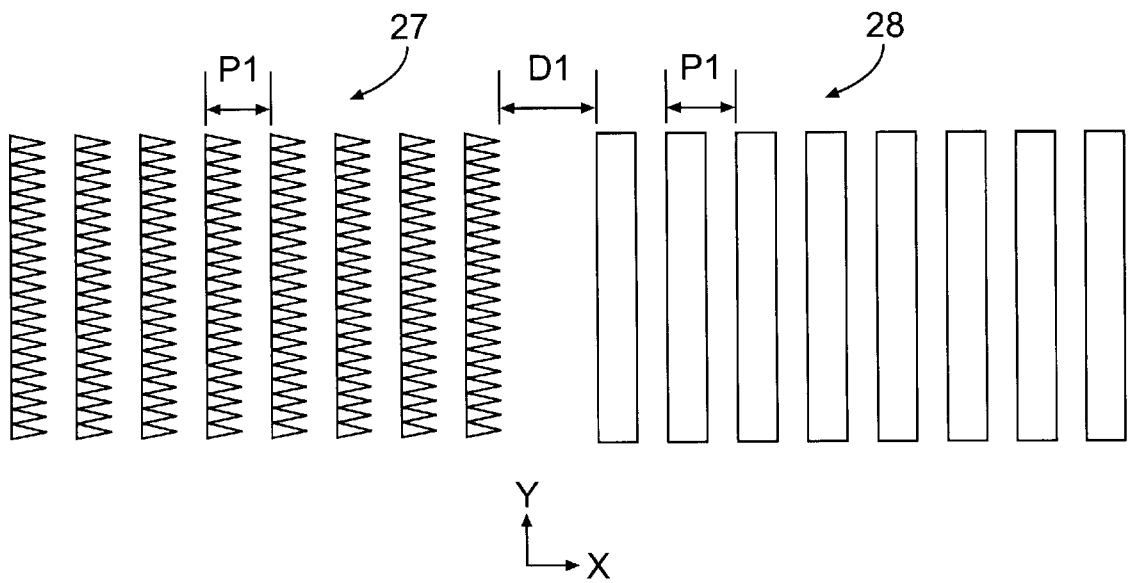
FIG. 6 is an enlarged plan view showing a second embodiment of an evaluation mark used in present invention.
Figure 7:
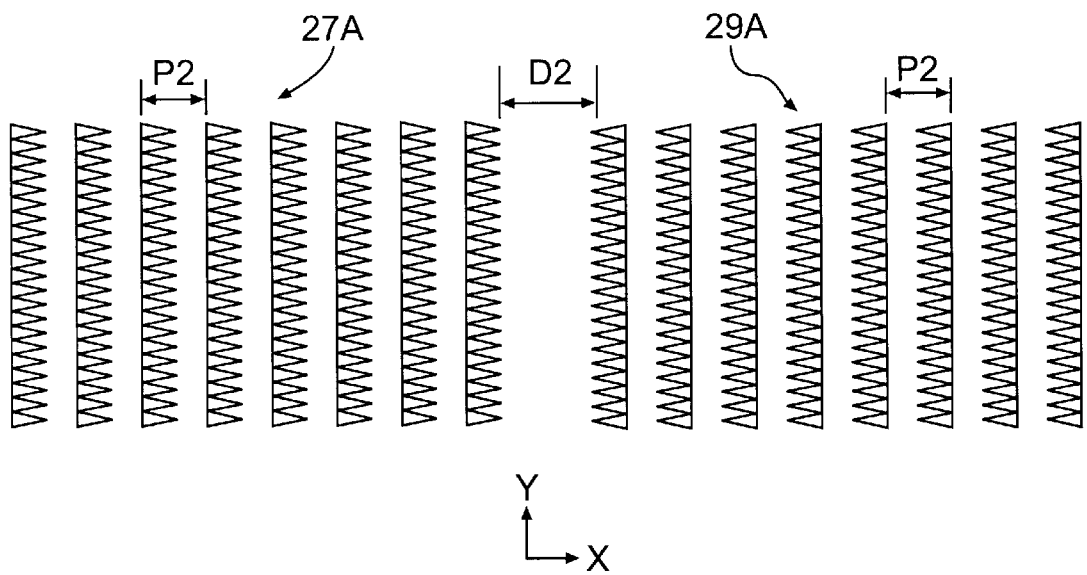
FIG. 7 is an enlarged plan view showing a third embodiment of an evaluation mark used in present invention.
Figure 8:
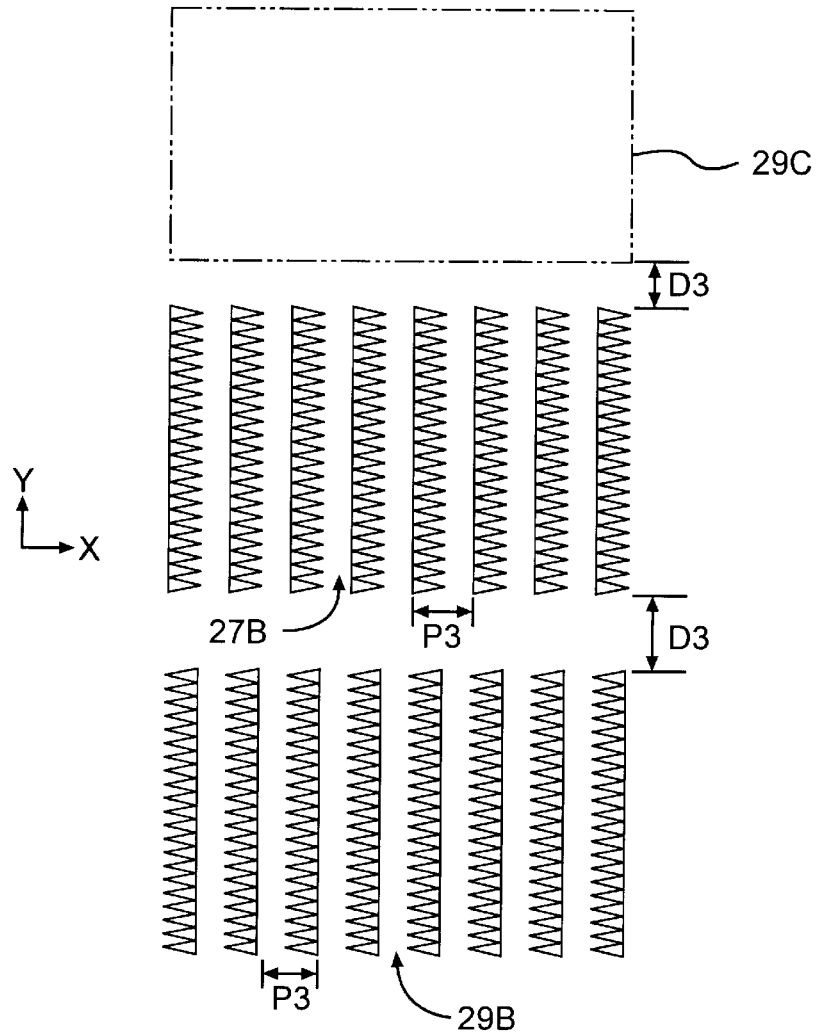
FIG. 8 is an enlarged plan view showing a fourth embodiment of an evaluation mark used in present invention.
Figure 9:
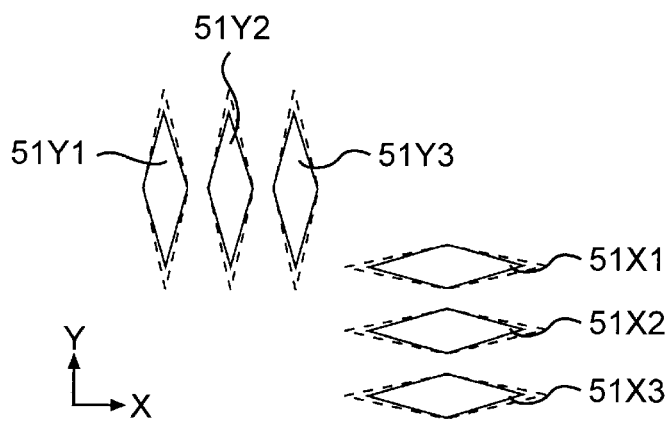
FIG. 9 is a diagram explaining a conventional method of obtaining the best focus position.

Next, 3 other examples of evaluation marks are explained referring to FIG. 6 through FIG. 8. All of the following examples are examples of evaluation marks wherein the measurement direction is the X-direction. However, if oriented properly, they would be equally applicable to perform measurement along the Y-direction.

FIG. 6 shows the first variant example of an evaluation mark. In FIG. 6 the evaluation mark is composed of a saw-tooth pattern 27 having a pitch P1 in which the apex of the fine marks is in the +X direction as in the evaluation marks 18XA of FIG. 4, and a pattern 28 composed of line-and-space patterns arranged at a fixed pitch P1 in the measurement direction (X-direction). The widths in the crosswise direction and lengthwise direction of the two patterns 27 and 28 are formed so as to be nearly equal, and the pattern 28 composed of line-and-space patterns is formed so as to be separated from the pattern 27 by an interval D1 wider than the specified pitch P1 in the direction of the points of the fine marks of the pattern 27 (in this case the +X direction).

When the positions of the evaluation pattern images on the wafer 6 are measured using an LIA-type alignment sensor 13 for each focus position by means of the evaluation marks of this example, the positions of the images of patterns 27 and 28 in each focus position are both measured. The focus position when the interval in the X direction between the patterns 27 and 28 is narrowest is defined as the best focus position. Specifically, the pattern 28 is a normal lattice pattern formed of a line-and-space pattern, and even if the focus position changes, the measurement value of the evaluation pattern image on the wafer 6 obtained by the alignment sensor 13 will not change. In contrast, since the image of the pattern 27 on the wafer 6 shifts in the right direction (+X direction) as the best focus position is approached, the interval between the images of the patterns 27 and 28 becomes narrowest at the best focus position. Also, when the apex of the fine marks of the pattern 27 is in the left direction (-X direction), the focus position when the interval between the two evaluation pattern images is widest is made the best focus position. When the evaluation marks of this example are used, the best focus position is evaluated based on the relative interval between the images of the two patterns 27 and 28 on the wafer 6 so that the accuracy of detection of the best focus position is increased.

FIG. 7 shows a second variant example of evaluation marks. As shown in FIG. 7, the evaluation marks in this example are composed by forming a saw-tooth pattern 27A at the same pitch P2 as the pattern 27 in FIG. 6 and a pattern 29A of pitch P2. Pattern 29A is inverted from left to right when compared to patter 27A and is formed at a specified interval D2 from pattern 27A. The measurement position of the image of the pattern 27A on the wafer 6 shifts to the right as the best focus position is approached, and the measurement position of the image of the pattern 29A on the wafer 6 shifts to the left as the best focus position is approached. Accordingly, the focus position when the interval in the X-direction between the images of the patterns 27A and 29A on the wafer 6 is at its narrowest is defined as the best focus position. When the evaluation mark of this example is used, as opposed to cases in which evaluation mark of FIG. 4 or FIG. 6 is used, the change in the interval between the evaluation pattern images proportional to the change in the focus position is doubled. Accordingly, the detection sensitivity of the best focus position is also doubled.

FIG. 8 shows a third variant example of an evaluation mark. In FIG. 8, the evaluation mark of this example is comprised of a saw-tooth pattern 27B having a pitch P3 in which the apex of the fine marks is in the +X direction in the same way as in the evaluation marks (18XA) in FIG. 4, and a pattern 29B having a pitch P3 in which the pattern 27B is inverted in the measurement direction. Pattern 29B is spaced from pattern 27B at a specified interval D3 in the non-measurement direction (Y-direction).

When the positions of the evaluation pattern images on the wafer 6 at each focus area in accordance with the evaluation mark of this example are measured using an LIA-type alignment sensor 13, the images of the patterns 27B and 29B in each focus position are measured while scanning the XY stage 8 in the non-measurement direction (Y-direction). Then, the focus position where the phase change of the respective heterodyne interference patterns from images of the patterns 27B and 29B is smallest is defined as the best focus position.

As indicated by the 2-point broken line in FIG. 8, an evaluation mark in which a pattern 29B and a pattern 29C (symmetrical to pattern 29B) are arranged in the non-measurement direction of the pattern 27B may also be successfully utilized. If this type of evaluation mark is used, even if the patterns 27B and 29B are formed at an inclination, or the scanning direction during measurement is inclined, the inclination of the images of the patterns 27B and 29B can be obtained and corrected from the measurement values of the positions of the images of the patterns 29B and 29C on the wafer 6.

Also, instead of an LIA-type alignment sensor, an FIA-type alignment sensor 12 can also be used as the alignment sensor which measures the position of the evaluation pattern images. In this way, the present invention is not limited to the foregoing working embodiments and may also assume various configurations within a range that does not exceed the essential features of the present invention.

It will be apparent to those skilled in the art that various modifications and variations can be made in the foreign substance inspecting apparatus of the present invention without departing from the spirit or scope of the invention. Thus, it is intended that the present invention cover the modifications and variations of this invention provided they come within the scope of the appended claims and their equivalents.

What is claimed is:

1. An exposure condition measurement method for determining the optimal focal plane of a projection optical system in a projection exposure apparatus, comprising the steps of:

forming a first evaluation mark including multiple intermediate constituent elements arranged in a lattice form along a measurement direction on a mask, each of said multiple intermediate constituent elements being formed by the alignment of multiple wedge-shaped fine constituent elements along a non-measurement direction, each of said multiple wedge-shaped fine constituent elements further including an apex, said apexes of said multiple wedge-shaped fine constituent elements are formed in the measurement direction, and wherein the measurement direction is perpendicular to the non-measurement direction;

placing said mask containing said first evaluation mark within an exposure field of the projection optical system and illuminating said mask to produce an image of said first evaluation mark;

projecting said image of said first evaluation mark via the projection optical system onto multiple differing partial areas of a photosensitive substrate for evaluation while changing the position of said photosensitive substrate along an optical axis of the projection optical system, wherein center positions of said images of said first evaluation mark projected respectively on the multiple differing partial areas of said photosensitive substrate correspond to the differing positions of said photosensitive substrate along said optical axis;

measuring said center positions of said images of said first evaluation mark projected on multiple differing partial areas of said photosensitive substrate; and determining an optimal focus position of said projection optical system based upon said measurement of said center positions of said images of said first evaluation mark on said photosensitive substrate.

2. An exposure condition measurement method for determining the optimal focal plane of a projection optical system in a projection exposure apparatus according to claim 1, further comprising the steps of:

forming a second evaluation mark including multiple intermediate constituent elements arranged in a lattice form along the measurement direction on said mask, said intermediate constituent elements of said second evaluation mark differing from the said intermediate constituent elements of said first evaluation mark, and wherein said intermediate constituent elements of said second evaluation mark are arranged in the measurement direction with respect to said intermediate constituent elements of said first evaluation mark;

placing said mask containing said second evaluation mark within the exposure field of the projection optical system and illuminating said mask to produce an image of said second evaluation mark;

projecting said image of said first evaluation mark along with said image of said second evaluation mark via the projection optical system onto multiple differing partial areas of said photosensitive substrate for evaluation;

measuring said center positions of said images of said first and second evaluation marks projected on multiple differing partial areas of said photosensitive substrate; and determining an optimal focus position of said projection optical system based upon changes in the interval between said center positions of said images of said first and second evaluation marks.

3. An exposure condition measurement method for determining the optimal focal plane of a projection optical system in a projection exposure apparatus according to claim 1, further comprising the steps of:

forming a second evaluation mark including multiple intermediate constituent elements arranged in a lattice form along the measurement direction on said mask, said intermediate constituent elements of said second evaluation mark differing from the said intermediate constituent elements of said first evaluation mark, and wherein said intermediate constituent elements of said second evaluation mark are arranged in the non-measurement direction with respect to said intermediate constituent elements of said first evaluation mark;

placing said mask containing said second evaluation mark within the exposure field of the projection optical system and illuminating said mask to produce an image of said second evaluation mark;

projecting said image of said first evaluation mark along with said image of said second evaluation mark via the projection optical system onto multiple differing partial areas of said photosensitive substrate for evaluation;

measuring said center positions of said images of said first and second evaluation marks projected on multiple differing partial areas of said photosensitive substrate; and determining an optimal focus position of said projection optical system based upon changes in the interval between said center positions of said images of said first and second evaluation marks.

4. An exposure condition measurement method for determining the optimal focal plane of a projection optical system in a projection exposure apparatus according to claim 2, wherein said second evaluation mark is a line-and-space pattern aligned in the measurement direction.

5. An exposure condition measurement method for determining the optimal focal plane of a projection optical system in a projection exposure apparatus according to claim 3, wherein said second evaluation mark is a line-and-space pattern aligned in the measurement direction.

6. An exposure condition measurement method for determining the optimal focal plane of a projection optical system in a projection exposure apparatus according to claim 2, wherein said second evaluation mark includes a pattern formed by the inversion of said evaluation mark with regard to the measurement direction.

7. An exposure condition measurement method for determining the optimal focal plane of a projection optical system in a projection exposure apparatus according to claim 3, wherein said second evaluation mark includes a pattern formed by the inversion of said evaluation mark with regard to the measurement direction.

8. An exposure condition measurement method for determining the optimal focal plane of a projection optical system in a projection exposure apparatus according to claim 1, wherein said step of measuring said center positions of said images of said first evaluation mark projected on multiple differing partial areas of said photosensitive substrate further includes projecting two coherent light beams on said first evaluation mark from differing directions, receiving interference light formed by diffraction of said coherent light beams from said first evaluation mark, and detecting the phase of the interference light.

9. A method of obtaining the optimal focal plane of a projection optical system in a projection exposure apparatus, comprising the steps of:

forming a first evaluation mark including a first pattern on a mask;

placing said mask containing said first evaluation mark within an exposure field of the projection optical system and illuminating said mask to produce an image of said first evaluation mark;

projecting said image of said first evaluation mark via the projection optical system onto multiple locations on a photosensitive substrate while changing the position of said photosensitive substrate along an optical axis of the projection optical system to create multiple exposures;

measuring center positions of said exposures using a light beam interference apparatus; and determining an optimal focus position of the projection optical system based upon said light beam interference measurement of said center positions of said exposures.

10. The method of claim 9, wherein:

the step of forming a first evaluation mark further includes forming a second evaluation mark including a second pattern on a mask, wherein said second pattern differs from said first pattern;

the step of said mask containing said first evaluation mark within an exposure field of the projection optical system and illuminating said mask to produce an image of said first evaluation mark further includes placing said mask containing said second evaluation mark within the exposure field of the projection optical system and illuminating said mask to produce an image of said second evaluation mark;

the projecting step further includes projecting said image of said first evaluation mark along with said image of said second evaluation mark via the projection optical system onto multiple locations on said photosensitive substrate to create multiple exposures;

the measuring step further includes measuring an interval between center positions of said exposures of said first and second evaluation marks using a light beam interference apparatus; and the determining step further includes determining an optimal focus position of said projection optical system based upon said light beam interference measurement of said interval between center positions of said exposures of said first and second evaluation marks.

11. A method of obtaining the optimal focal plane of a projection optical system in a projection exposure apparatus comprising the steps of:

forming a first evaluation mark including multiple elongate, saw-toothed elements spaced in parallel along a measurement direction on a mask;

placing said mask containing said first evaluation mark within an exposure field of the projection optical system and illuminating said mask to produce an image of said first evaluation mark;

projecting said image of said first evaluation mark via the projection optical system onto a first location on a photosensitive substrate so as to form a first exposure;

changing the position of said photosensitive substrate along an optical axis of the projection optical system;

projecting said image of said first evaluation mark via the projection optical system onto a second location on a photosensitive substrate so as to form a second exposure;

measuring center positions of said exposures of said first evaluation mark projected on said photosensitive substrate; and determining an optimal focus position of the projection optical system based upon said measurement of said center positions of said exposures of said first evaluation mark.

12. The method of claim 11, further comprising the steps of:

forming a second evaluation mark including multiple elongate elements spaced in parallel along the measurement direction on said mask, said multiple elements of said second evaluation mark differing from the said multiple elements of said first evaluation mark, and wherein said second evaluation mark is spaced in the measurement direction from to said multiple elements of said first evaluation mark;

placing said mask containing said second evaluation mark within the exposure field of the projection optical system and illuminating said mask to produce an image of said second evaluation mark;

projecting said image of said first evaluation mark along with said image of said second evaluation mark via the projection optical system onto a first location on a photosensitive substrate so as to form a first exposure;

changing the position of said photosensitive substrate along an optical axis of the projection optical system;

projecting said image of said first evaluation mark along with said image of said second evaluation mark via the projection optical system onto a second location on a photosensitive substrate so as to form a second exposure;

measuring an interval between center positions of said exposures of said first and second evaluation marks projected on said photosensitive substrate; and determining an optimal focus position of the projection optical system based upon said measurement of said interval between center positions of said exposures of said first and second evaluation marks.

13. The method of claim 11, further comprising the steps of:

forming a second evaluation mark including multiple elongate elements spaced in parallel along the measurement direction on said mask, said multiple elements of said second evaluation mark differing from the said multiple elements of said first evaluation mark, and wherein said second evaluation mark is spaced in the non-measurement direction from to said multiple elements of said first evaluation mark;

placing said mask containing said second evaluation mark within the exposure field of the projection optical system and illuminating said mask to produce an image of said second evaluation mark;

projecting said image of said first evaluation mark along with said image of said second evaluation mark via the projection optical system onto a first location on a photosensitive substrate so as to form a first exposure;

changing the position of said photosensitive substrate along an optical axis of the projection optical system;

projecting said image of said first evaluation mark along with said image of said second evaluation mark via the projection optical system onto a second location on a photosensitive substrate so as to form a second exposure;

measuring an interval between center positions of said exposures of said first and second evaluation marks projected on said photosensitive substrate; and determining an optimal focus position of the projection optical system based upon said measurement of said interval between center positions of said exposures of said first and second evaluation marks.

14. The method of claim 12, wherein said second evaluation mark includes a line-and-space pattern.

15. The method of claim 13, wherein said second evaluation mark includes a line-and-space pattern.

16. The method of claim 12, wherein said second evaluation mark includes a pattern formed by the inversion of said evaluation mark with respect to the measurement direction.

17. The method of claim 13, wherein said second evaluation mark includes a pattern formed by the inversion of said evaluation mark with respect to the measurement direction.

18. The method of claim 11, wherein said step of measuring center positions of said images of said first evaluation mark projected on said photosensitive substrate further includes the step of using a light beam interference apparatus to measure said center positions of said images of said first evaluation mark projected on said photosensitive substrate.

19. The method of claim 11, wherein said step of measuring center positions of said images of said first evaluation mark projected on said photosensitive substrate further includes the step of using an image pick-up apparatus to measure said center positions of said images of said first evaluation mark projected on said photosensitive substrate.

20. A method for determining the optimal exposure condition in an exposure apparatus, comprising the steps of:

exposing each of multiple different partial areas on a substrate to an image of a mark formed on a mask through a projection optical system while changing the exposure condition;

detecting images of said mark formed on the substrate to obtain position information of the images; and determining the optimal exposure condition based upon said position information, wherein said position information comprises the center position of said images of said mark formed on the substrate.

21. The method according to claim 20, wherein said exposure condition comprises the position of said substrate along an optical axis of the projection optical system.

22. The method according to claim 20, wherein said substrate is positioned at measurement points of said images of said mark formed on the substrate sequentially during the detecting step.

23. The method according to claim 20, wherein said mark on said mask includes multiple elongate, saw-toothed elements arranged in a diffraction grating form along a measurement direction.

24. The method according to claim 20, wherein said detecting step comprises obtaining said position information by the use of a light beam interference apparatus.

25. The method according to claim 20, wherein said detecting step comprises obtaining said position information by the use of an image pick-up apparatus.

26. A method for determining the optimal exposure condition in an exposure apparatus, comprising the steps of:

exposing each of multiple different partial areas on a substrate to an image of a mark formed on a mask through a projection optical system while changing the exposure condition;

detecting images of said mark formed on the substrate by the use of a detector of the light beam interference type; and determining the optimal exposure condition based upon the result of the detecting step.

27. The method according to claim 26, wherein said exposure condition comprises the position of said substrate along an optical axis of the projection optical system.

28. The method according to claim 26, wherein said substrate is positioned at measurement points of said images of said mark formed on the substrate sequentially during the detecting step.

29. The method according to claim 26, wherein said mark on said mask includes multiple elongate, saw-toothed elements arranged in a diffraction grating form along a measurement direction.

30. The method according to claim 26, wherein position information of the images is obtained during the detecting step.

31. The method according to claim 30, wherein said position information comprises the center position of said images of said mark formed on the substrate.

* * * * *